(12) United States Patent
Kim et al.

(10) Patent No.: US 12,218,238 B2
(45) Date of Patent: Feb. 4, 2025

(54) GROWTH STRUCTURE FOR STRAINED CHANNEL, AND STRAINED CHANNEL USING THE SAME AND METHOD OF MANUFACTURING DEVICE USING THE SAME

(71) Applicant: Korea Advanced Institute of Science and Technology, Daejeon (KR)

(72) Inventors: Sanghyeon Kim, Daejeon (KR); Hyeongrak Lim, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 455 days.

(21) Appl. No.: 17/522,851

(22) Filed: Nov. 9, 2021

(65) Prior Publication Data

US 2022/0216338 A1    Jul. 7, 2022

(51) Int. Cl.
| | | |
|---|---|---|
| *H01L 21/00* | (2006.01) | |
| *H01L 21/762* | (2006.01) | |
| *H01L 29/66* | (2006.01) | |
| *H01L 29/78* | (2006.01) | |

(52) U.S. Cl.
CPC .... *H01L 29/7849* (2013.01); *H01L 21/76251* (2013.01); *H01L 29/66742* (2013.01)

(58) Field of Classification Search
CPC .......... H01L 29/7849; H01L 21/76251; H01L 29/66742
See application file for complete search history.

(56) References Cited

U.S. PATENT DOCUMENTS 9,978,833 B2 * 5/2018 Kittl ................. H01L 29/66545

FOREIGN PATENT DOCUMENTS

| | | |
|---|---|---|
| JP | 2019523994 A | 8/2019 |
| KR | 1020040005612 | 1/2004 |
| KR | 1020120079800 | 7/2012 |
| KR | 1020160091173 | 8/2016 |

OTHER PUBLICATIONS

Solid-State Electronics 54 (2010) 327-335, "The impact of self-heating and SiGe strain-relaxed buffer thickness on the analog performance of strained Si nMOSFETs", 9 pages, Oct. 12, 2009.

* cited by examiner

*Primary Examiner* — Richard A Booth
(74) *Attorney, Agent, or Firm* — CHRISTENSEN O'CONNOR JOHNSON KINDNESS PLLC

(57) ABSTRACT

Disclosed are a growth structure for a strained channel, and a strained channel using the same and a method of manufacturing a device using the same. The growth structure for a strained channel includes a support substrate, a strain-relaxed buffer (SRB) layer disposed on a support substrate, a base growth layer grown to have one composition on the SRB layer, and a strained channel layer grown to have another composition on the base growth layer. The strained channel layer may include at least one of a tensile-strained channel layer or a compressively strained channel layer.

7 Claims, 32 Drawing Sheets

GROWTH STRUCTURE FOR STRAINED CHANNEL, AND STRAINED CHANNEL USING THE SAME AND METHOD OF MANUFACTURING DEVICE USING THE SAME

CROSS-REFERENCES TO RELATED APPLICATIONS

This application is based on and claims priority under 35 U.S.C. 119 to Korean Patent Application No. 10-2021-0000429, filed on Jan. 4, 2021 in the Korean intellectual property office, the disclosure of which is herein incorporated by reference in its entirety.

TECHNICAL FIELD

Various embodiments relate to a growth structure for a strained channel, and a strained channel using the same and a method of manufacturing a device using the same.

BACKGROUND OF THE INVENTION

The mobility of electrons and holes in a strained material layer is significantly higher than the mobility thereof in bulk silicon. Accordingly, if a device includes a strained channel, the device will have improved operating performance. For example, the device may operate at a high speed by using low consumption power. Accordingly, there is a need for a technology for implementing a strained channel and a device having the strained channel.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

Various embodiments provide a growth structure for a strained channel, and a strained channel using the same and a method of manufacturing a device using the same. Specifically, various embodiments provide a growth structure for fabricating a strained channel. Furthermore, various embodiments provide a method of implementing a strained channel by using a growth structure. Furthermore, various embodiments provide a method of fabricating a device by using a growth structure.

According to various embodiments, a growth structure for a strained channel may include a support substrate, a strain-relaxed buffer (SRB) layer disposed on a support substrate, a base growth layer grown to have one composition on the SRB layer, and a strained channel layer grown to have another composition on the base growth layer.

According to various embodiments, a method of fabricating a strained channel may include preparing a growth structure for the strained channel and a base substrate, rotating the growth structure and bonding a strained channel layer to the top of the base substrate, and removing a base growth layer, an SRB layer, and a support substrate from the top of the strained channel layer by leaving the strained channel layer on the base substrate.

According to various embodiments, a method of manufacturing a device using a strained channel may include forming electrodes on a strained channel layer remained on a base substrate.

According to various embodiments, a device having a strained channel layer can be fabricated by using a monolithic integration method. That is, a growth structure for a strained channel is implemented because a strained channel layer is grown on a support substrate by using a hetero-epitaxy method. The strained channel layer can be easily bonded on a base substrate based on such a growth structure. Moreover, a device having the strained channel layer can be fabricated by using the growth structure. Accordingly, a device having improved operating performance can be fabricated.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

While illustrative embodiments have been illustrated and described, it will be appreciated that various changes can be made therein without departing from the spirit and scope of the invention.

Hereinafter, various embodiments of this document are described with reference to the accompanying drawings.

Figure 1:
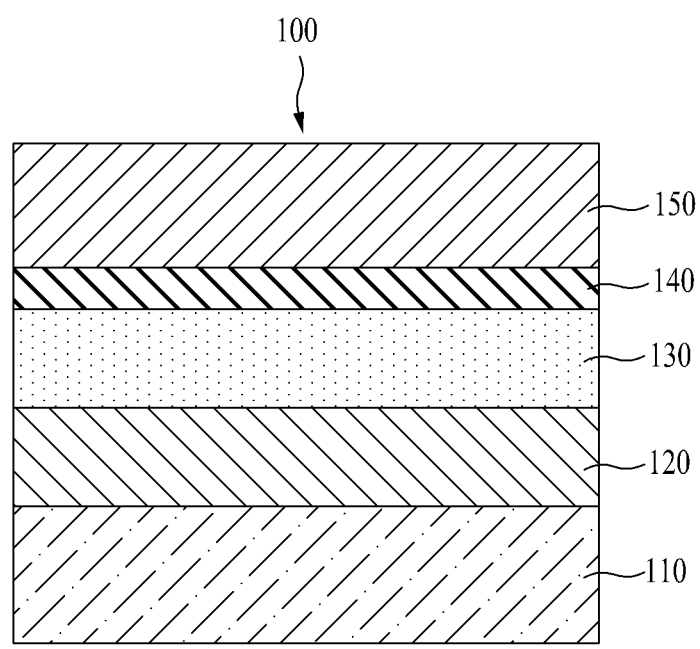
FIG. 1 is a diagram illustrating a growth structure for a strained channel according to first embodiments.

FIG. 1 is a diagram illustrating a growth structure 100 for a strained channel according to first embodiments.

Referring to FIG. 1, the growth structure 100 for a strained channel according to the first embodiments may include a support substrate 110, a strain-relaxed buffer (SRB) layer 120, a base growth layer 130 and 140, and a strained channel layer 150.

The support substrate 110 may support the SRB layer 120, the base growth layer 130 and 140, and the strained channel layer 150. For example, the support substrate 110 may be made of silicon (Si).

The SRB layer 120 may be disposed on the support substrate 110. In this case, the SRB layer 120 may be a lattice mismatch with the strained channel layer 150. In other words, a lattice constant of the SRB layer 120 may be different from a lattice constant of the strained channel layer 150. Accordingly, a stain may be applied to the strained channel layer 150 through the SRB layer 120.

The base growth layer 130 and 140 and the strained channel layer 150 may be grown on the SRB layer 120 by using a hetero-epitaxy method. For example, the base growth layer 130 and 140 and the strained channel layer 150 may be made of a silicon (Si)-germanium (Ge) material. In this case, the base growth layer 130 and 140 and the strained channel layer 150 may be grown on the SRB layer 120 based on different etch rates.

The base growth layer 130 and 140 may be disposed on the SRB layer 120. In this case, the base growth layer 130 and 140 may be grown to have a first composition (e.g., y) on the SRB layer 120. For example, the base growth layer 130 and 140 may be made of at least one of silicon ($Si_{1-y}$) or germanium ($Ge_y$). Furthermore, the base growth layer 130 and 140 may include a plurality of layers. For example, the base growth layer 130 and 140 may include a buffer layer 130 and a p-type layer 140. The buffer layer 130 may be disposed on the SRB layer 120, and the p-type layer 140 may be disposed on the buffer layer 130. For example, the buffer layer 130 may be denoted as a germanium (Ge)-rich silicon-germanium ($Si_{1-y}Ge_y$) buffer layer. The p-type layer 140 may be denoted as a p-type germanium (Ge)-rich silicon-germanium ($Si_{1-y}Ge_y$) material layer.

The strained channel layer 150 may be disposed on the base growth layer 130 and 140. In this case, the strained channel layer 150 may be grown as a single channel structure. That is, as a strain is applied to the strained channel layer 150 by the SRB layer 120, the strained channel layer 150 may be grown to have a second composition (e.g., z) on the base growth layer 130 and 140. In this case, the strained channel layer 150 may be denoted as a tensile-strained channel layer. For example, the strained channel layer 150 may be made of at least one of silicon ($Si_{1-z}$) or germanium ($Ge_z$).

FIGS. 2A to 2G are diagrams illustrating a method of fabricating a strained channel according to the first embodiments.

First, after the growth structure 100 for a strained channel, such as that illustrated in FIG. 1, and a base substrate 220 are prepared, as illustrated in FIGS. 2A to 2D, the growth structure 100 may be bonded to the top of the base substrate 220. In this case, the growth structure 100 may be bonded to the top of the base substrate 220 by using a monolithic integration method.

Figure 2A:
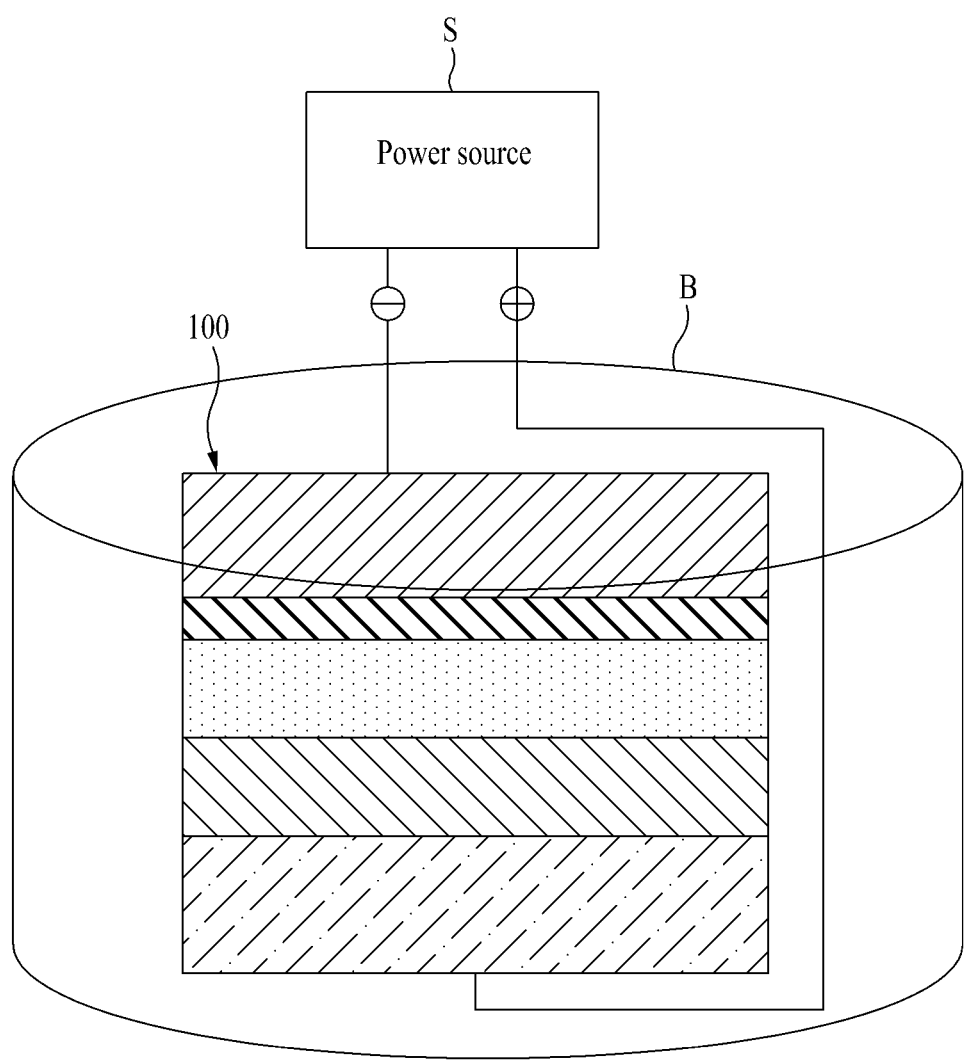
FIGS. 2A to 2G are diagrams illustrating a method of fabricating a strained channel according to the first embodiments.
Figure 2B:
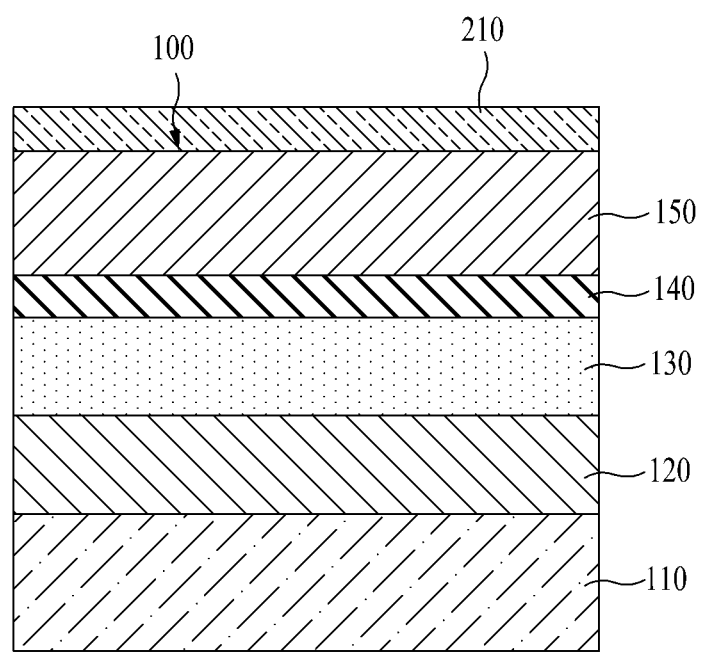

As illustrated in FIGS. 2A and 2B, a first insulating layer 210 may be formed on the strained channel layer 150 of the growth structure 100. In this case, the first insulating layer 210 may be formed on an strained channel layer 150 by using a thin film deposition technique. Specifically, as illustrated in FIG. 2A, the growth structure 100 may be dipped into a bath B containing a solvent. A voltage may be applied to the growth structure 100 through a power source S. Accordingly, as illustrated in FIG. 2B, the first insulating layer 210 may be formed on the strained channel layer 150.

Figure 2C:
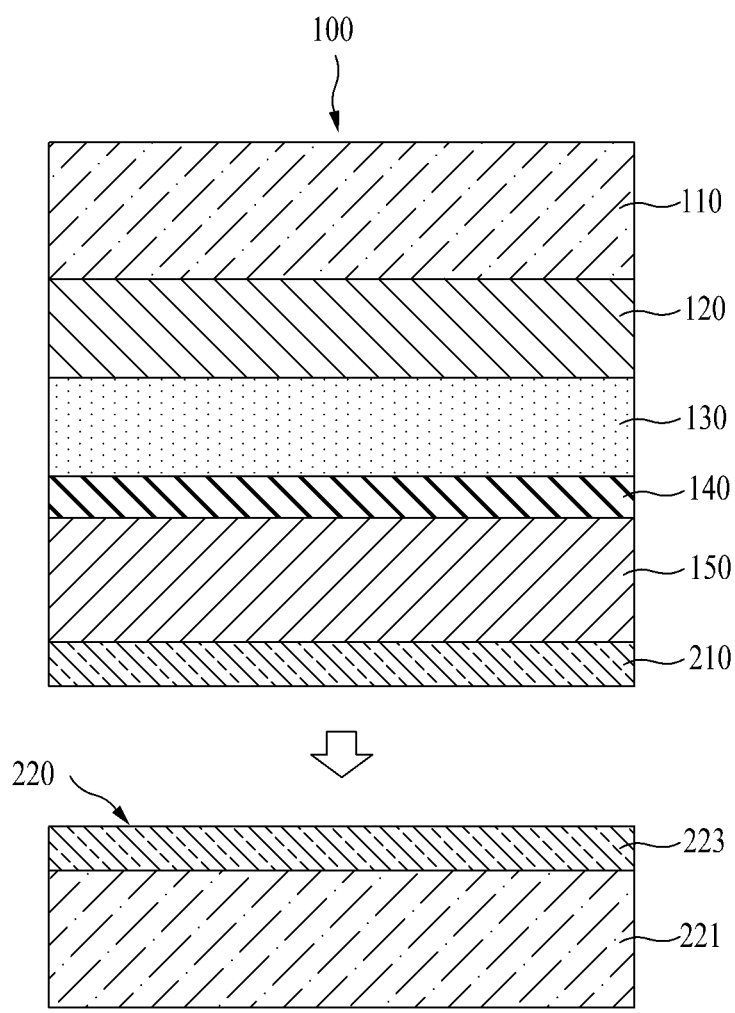

Next, as illustrated in FIG. 2C, the growth structure 100 may be rotated. That is, the growth structure 100 may be rotated so that the first insulating layer 210 is directed toward the base substrate 220, in other words, the base growth layer 130 and 140 and the strained channel layer 150 are inverted. The base substrate 220 may include a support substrate 221 and a second insulating layer 223 disposed on the support substrate 221. In this case, the second insulating layer 223 may be exposed to the growth structure 100, that is, the strained channel layer 150. Accordingly, the first insulating layer 210 may face the second insulating layer 223, the strained channel layer 150 may be disposed on the first insulating layer 210, and the base growth layer 130 and 140 may be disposed on the strained channel layer 150. In this case, the p-type layer 140 may be disposed on the strained channel layer 150, and the buffer layer 130 may be disposed on the p-type layer 140. Furthermore, the SRB layer 120 may be disposed on the base growth layer 130 and 140, and the support substrate 110 may be disposed on the SRB layer 120.

Figure 2D:
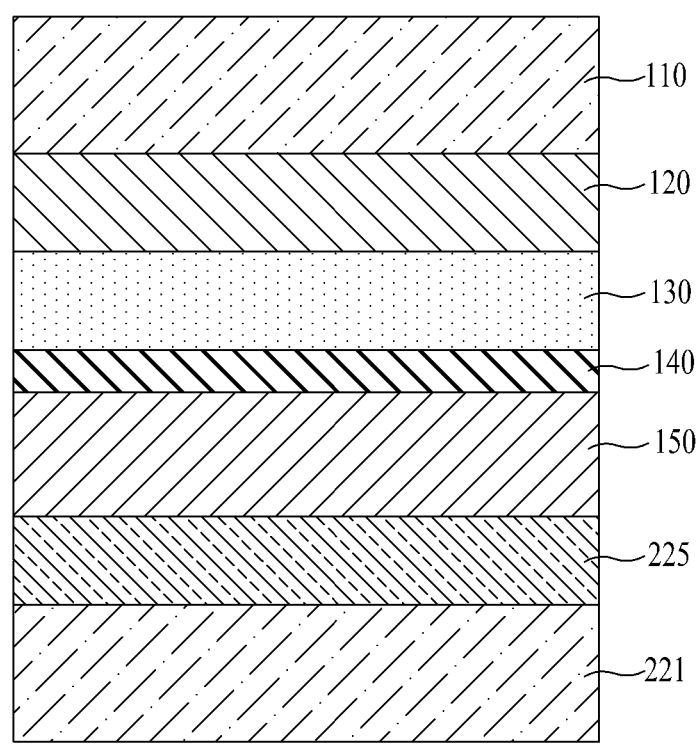

Next, as illustrated in FIG. 2D, the growth structure 100 may be bonded to the top of the base substrate 220. That is, the strained channel layer 150 may be bonded to the top of the base substrate 220 through the first insulating layer 210. In this case, as the first insulating layer 210 is combined with the second insulating layer 223, an insulating layer 225 may be formed between the strained channel layer 150 and the support substrate 221 and the strained channel layer 150 may be bonded to the top of the base substrate 220.

Figure 2E:
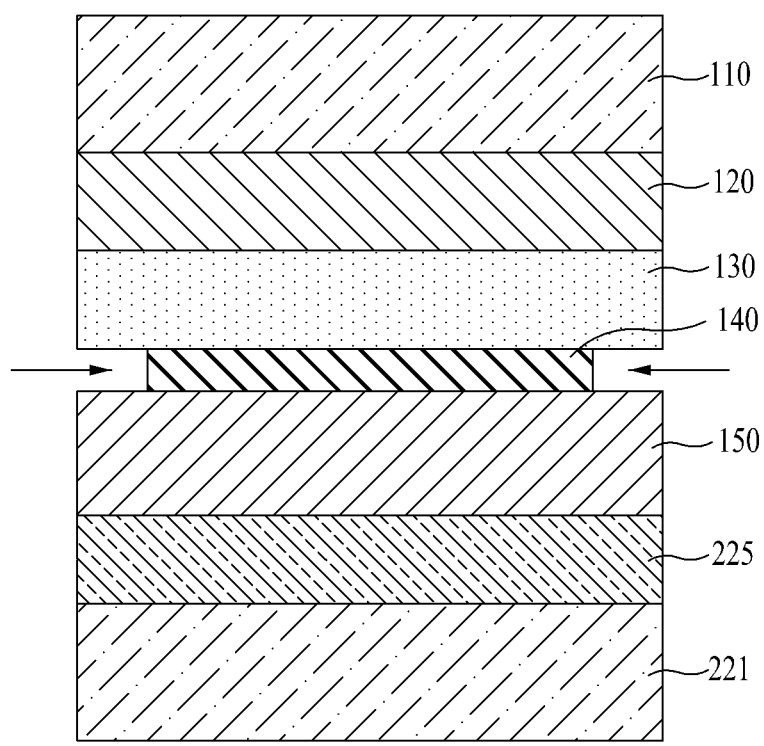
Figure 2F:
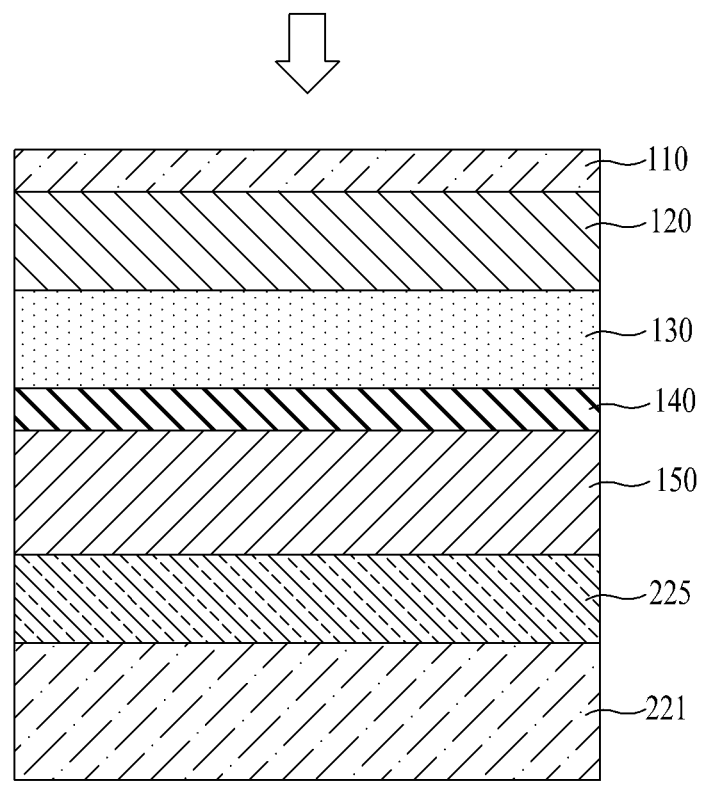
Figure 2G:
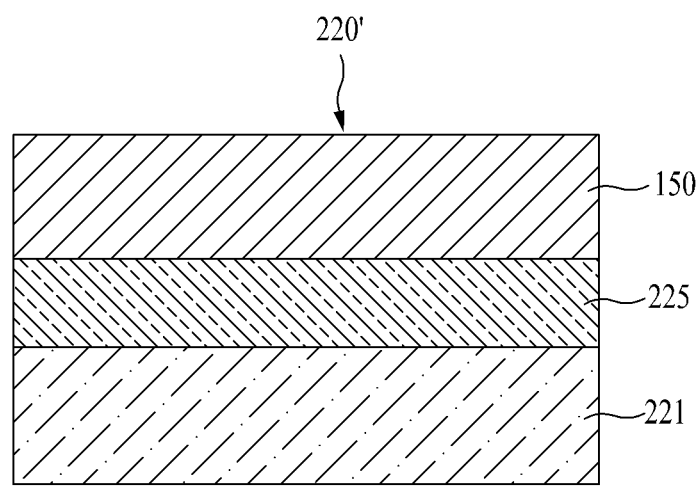

Finally, the base growth layer 130 and 140, the SRB layer 120, and the support substrate 110 may be removed from the top of the strained channel layer 150. In this case, the base growth layer 130 and 140, the SRB layer 120, and the support substrate 110 may be removed from the top of the strained channel layer 150 by using at least one of an anodizing technique, a grinding technique or an etching technique. According to an embodiment, as illustrated in FIG. 2E, the p-type layer 140 may be removed on the strained channel layer 150 by using the anodizing technique. Optionally, a surface of the strained channel layer 150 may be mechanically grinded. Accordingly, the buffer layer 130, the SRB layer 120, and the support substrate 110 may be separated from the strained channel layer 150. As a result, as illustrated in FIG. 2G, the strained channel layer 150 may remain. According to another embodiment, as illustrated in FIG. 2F, the support substrate 110, the SRB layer 120, and the base growth layer 130 and 140 may be sequentially removed using the grinding technique and the etching technique. As a result, as illustrated in FIG. 2G, the strained channel layer 150 may remain.

According to the first embodiments, as illustrated in FIG. 2G, a strained channel substrate 220' may be fabricated. The strained channel substrate 220' may include the support substrate 221, the insulating layer 225 disposed on the support substrate 221, and the strained channel layer 150 disposed on the insulating layer 225. In this case, the strained channel layer 150 may represent a strained channel having a single channel structure.

Figure 3:
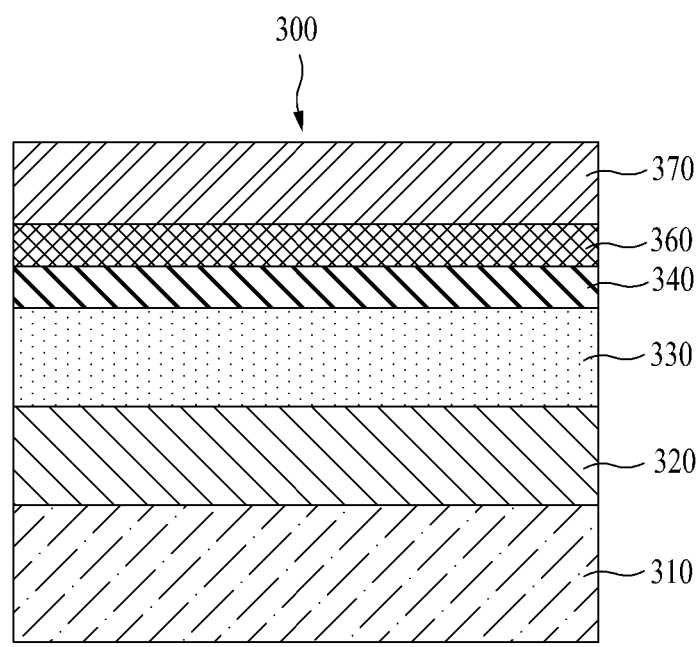
FIG. 3 is a diagram illustrating a growth structure for a strained channel according to second embodiments.

FIG. 3 is a diagram illustrating a growth structure 300 for a strained channel according to second embodiments.

Referring to FIG. 3, the growth structure 300 for a strained channel according to the second embodiments may include a support substrate 310, a strain-relaxed buffer (SRB) 320, a base growth layer 330 and 340, an etch-stop layer 360, and a strained channel layer 370.

The support substrate 310 may support the SRB layer 320, the base growth layer 330 and 340, the etch-stop layer 360, and the strained channel layer 370. For example, the support substrate 310 may be made of silicon (Si).

The SRB layer 320 may be disposed on the support substrate 310. In this case, the SRB layer 320 may be a lattice mismatch with the strained channel layer 370. In other words, a lattice constant of the SRB layer 320 may be different from a lattice constant of the strained channel layer 370. Accordingly, a strain may be applied to the strained channel layer 370 through the SRB layer 320.

The base growth layer 330 and 340 and the strained channel layer 370 may be grown on the SRB layer 320 by using a hetero-epitaxy method. For example, the base growth layer 330 and 340 and the strained channel layer 370 may be made of a silicon (Si)-germanium (Ge) material. In this case, the base growth layer 330 and 340 and the strained channel layer 370 may be grown on the SRB layer 320 based on different etch rates.

The base growth layer 330 and 340 may be disposed on the SRB layer 320. In this case, the base growth layer 330 and 340 may be grown to have a first composition (e.g., y) on the SRB layer 320. For example, the base growth layer 330 and 340 may be made of at least one of silicon ($Si_{1-y}$) or germanium ($Ge_y$). Furthermore, the base growth layer 330 and 340 may include a plurality of layers. For example, the base growth layer 330 and 340 may include a buffer layer 330 and a p-type layer 340. The buffer layer 330 may be disposed on the SRB layer 320. The p-type layer 340 may be disposed on the buffer layer 330. For example, the buffer layer 330 may be denoted as a germanium (Ge)-rich silicon-germanium ($Si_{1-y}Ge_y$) buffer layer. The p-type layer 340 may be denoted as a p-type germanium (Ge)-rich silicon-germanium ($Si_{1-y}Ge_y$) material layer.

The etch-stop layer 360 may be disposed on the base growth layer 330 and 340.

The strained channel layer 370 may be disposed on the etch-stop layer 360. In this case, the strained channel layer 370 may be grown as a single channel structure. That is, as a strain is applied to the strained channel layer 370 by the SRB layer 320, the strained channel layer 370 may be grown to have a third composition (e.g., x) on the etch-stop layer 360. In this case, the strained channel layer 370 may be denoted as a compressively-strained channel layer. For example, the strained channel layer 370 may be made of at least one of silicon ($Si_{1-x}$) or germanium ($Ge_x$).

FIGS. 4A to 4H are diagrams illustrating a method of fabricating a strained channel according to the second embodiments.

First, after the growth structure 300 for a strained channel, such as that illustrated in FIG. 3, and a base substrate 420 are prepared, as illustrated in FIGS. 4A to 4D, the growth structure 300 may be bonded to the top of the base substrate 420. In this case, the growth structure 300 may be bonded to the top of the base substrate 420 by using a monolithic integration method.

Figure 4A:
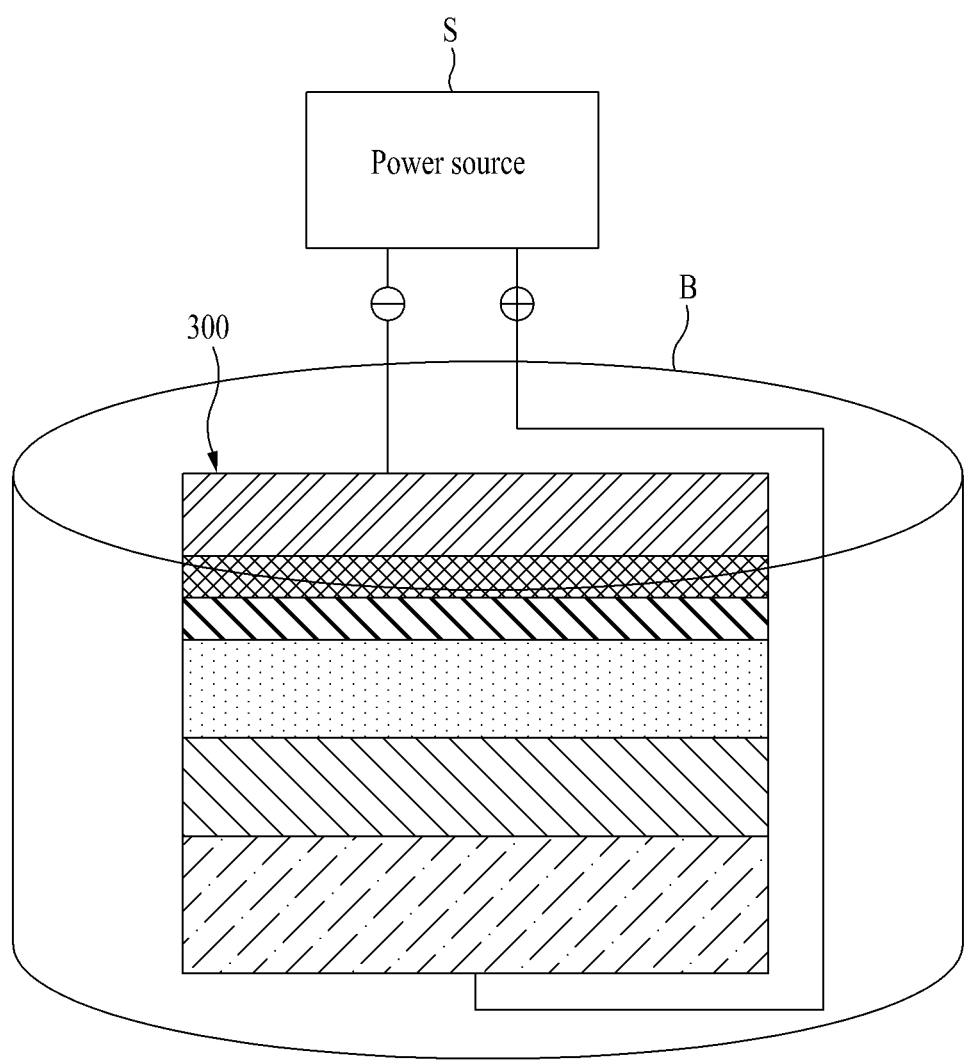
FIGS. 4A to 4H are diagrams illustrating a method of fabricating a strained channel according to the second embodiments.
Figure 4B:
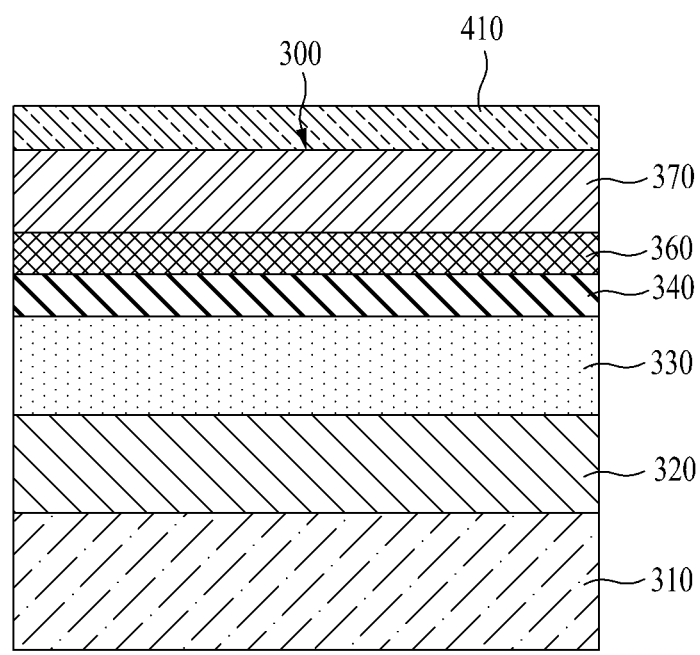

As illustrated in FIGS. 4A and 4B, a first insulating layer 410 may be formed on the strained channel layer 370 of the growth structure 300. In this case, the first insulating layer 410 may be formed on an the strained channel layer 370 by using a thin film deposition technique. Specifically, as illustrated in FIG. 4A, the growth structure 300 may be dipped into a bath B containing a solvent, and a voltage may be applied to the growth structure 300 through a power source S. Accordingly, as illustrated in FIG. 4B, the first insulating layer 410 may be formed on the strained channel layer 370.

Figure 4C:
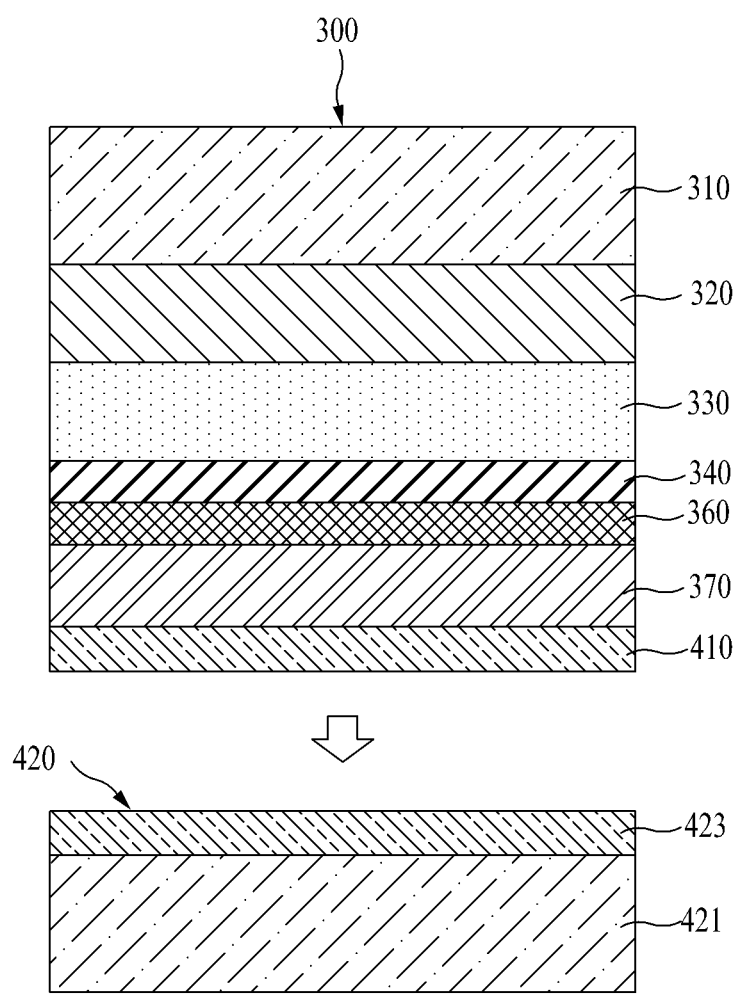

Next, as illustrated in FIG. 4C, the growth structure 300 may be rotated. That is, the growth structure 300 may be rotated so that the first insulating layer 410 is directed toward the base substrate 420, in other words, the base growth layer 330 and 340 and the strained channel layer 370 are inverted. The base substrate 420 may include a support substrate 421 and a second insulating layer 423 disposed on the support substrate 421. In this case, the second insulating layer 423 may be exposed to the growth structure 300, that is, the strained channel layer 370. Accordingly, the first insulating layer 410 may face the second insulating layer 423, the strained channel layer 370 may be disposed on the first insulating layer 410, and the base growth layer 330 and 340 may be disposed on the strained channel layer 370. In this case, the etch-stop layer 360 may be disposed on the strained channel layer 370, the p-type layer 340 may be disposed on the etch-stop layer 360, and the buffer layer 330 may be disposed on the p-type layer 340. Furthermore, the SRB layer 320 may be disposed on the base growth layer 330 and 340, and the support substrate 310 may be disposed on the SRB layer 320.

Figure 4D:
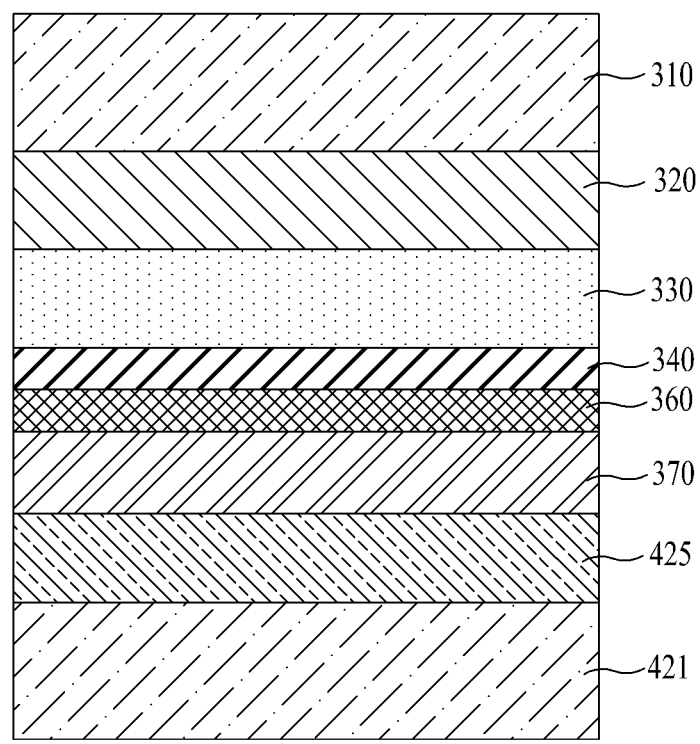

Next, as illustrated in FIG. 4D, the growth structure 300 may be bonded to the top of the base substrate 420. That is, the strained channel layer 370 may be bonded to the top of the base substrate 420 through the first insulating layer 410. In this case, as the first insulating layer 410 is combined with the second insulating layer 423, an insulating layer 425 may be formed between the strained channel layer 370 and the support substrate 421, and the strained channel layer 370 may be bonded to the top of the base substrate 420.

Figure 4E:
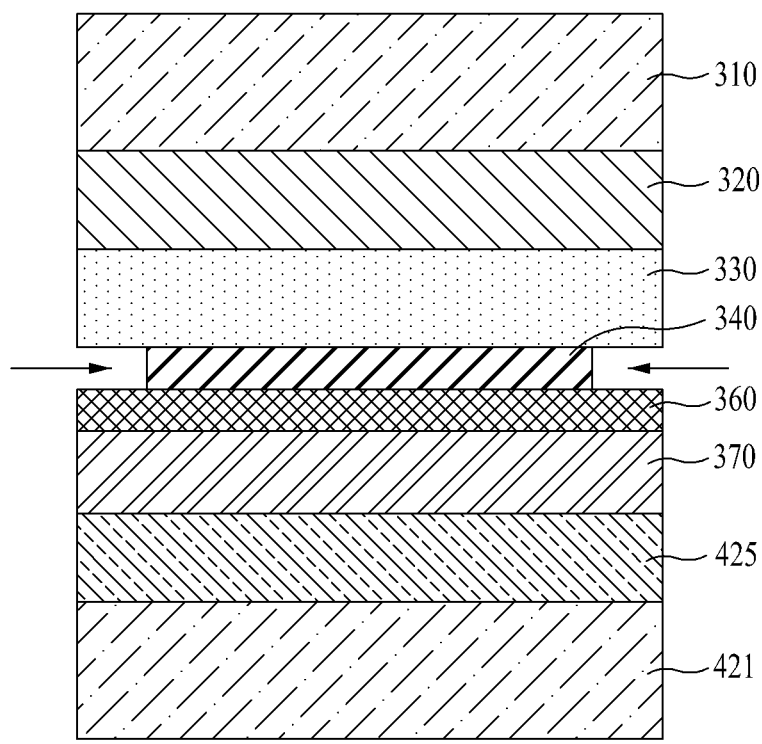
Figure 4F:
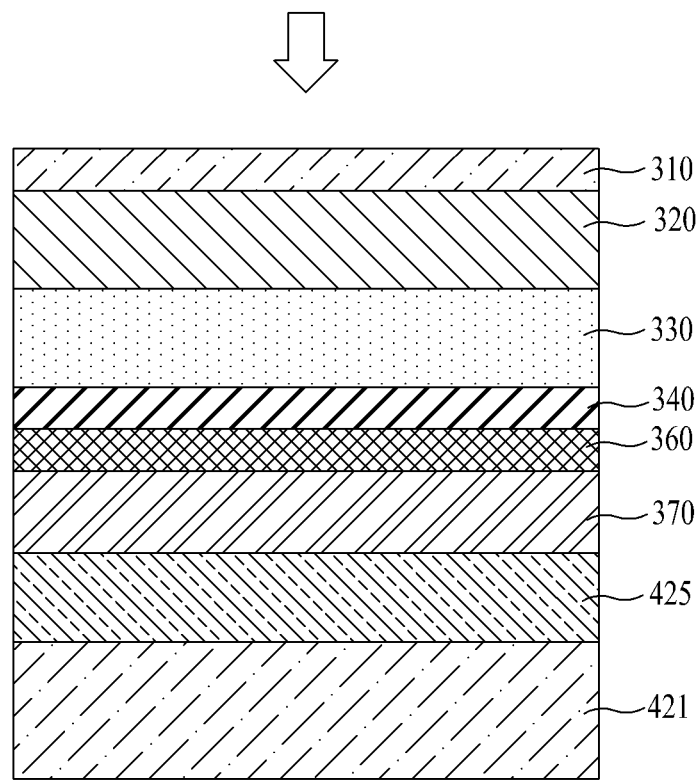
Figure 4G:
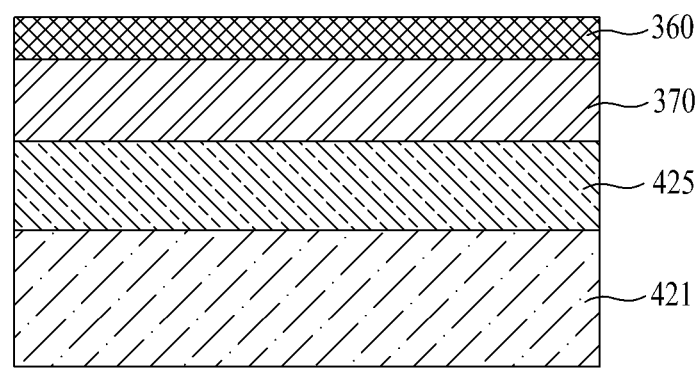

Finally, the etch-stop layer 360, the base growth layer 330 and 340, the SRB layer 320, and the support substrate 310 may be removed from the top of the strained channel layer 370. In this case, the base growth layer 330 and 340, the SRB layer 320, and the support substrate 310 may be removed from the top of the etch-stop layer 360 by using at least one of an anodizing technique, a grinding technique or an etching technique. According to an embodiment, as illustrated in FIG. 4E, the p-type layer 340 may be removed on the etch-stop layer 360 by using the anodizing technique. Optionally, a surface of the etch-stop layer 360 may be mechanically grinded. Accordingly, the buffer layer 330, the SRB layer 320, and the support substrate 310 may be separated from the etch-stop layer 360. As a result, as illustrated in FIG. 4G, the etch-stop layer 360 and the strained channel layer 370 may remain. According to another embodiment, as illustrated in FIG. 4F, the support substrate 310, the SRB layer 320, and the base growth layer 330 and 340 may be sequentially removed by using the grinding technique and the etching technique. As a result, as illustrated in FIG. 4G, the etch-stop layer 360 and the strained channel layer 370 may remain. Thereafter, as illustrated in FIG. 4H, the etch-stop layer 360 may be removed from the top of the strained channel layer 370.

Figure 4H:
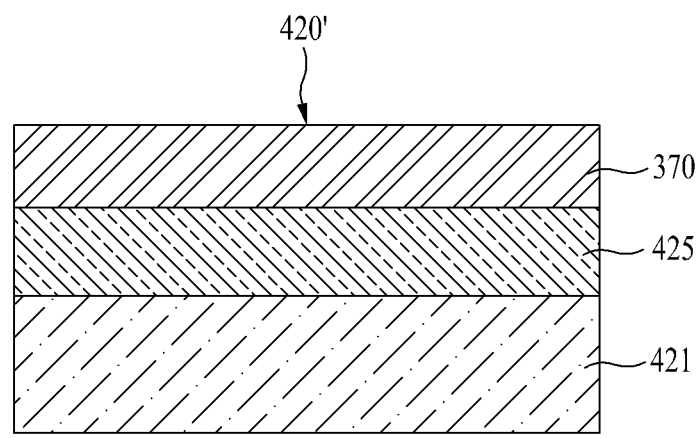

According to the second embodiments, as illustrated in FIG. 4H, a strained channel substrate 420' may be fabricated. The strained channel substrate 420' may include the support substrate 421, the insulating layer 425 disposed on the support substrate 421, and the strained channel layer 370 disposed on the insulating layer 425. In this case, the strained channel layer 370 may represent a strained channel having a single channel structure.

Figure 5A:
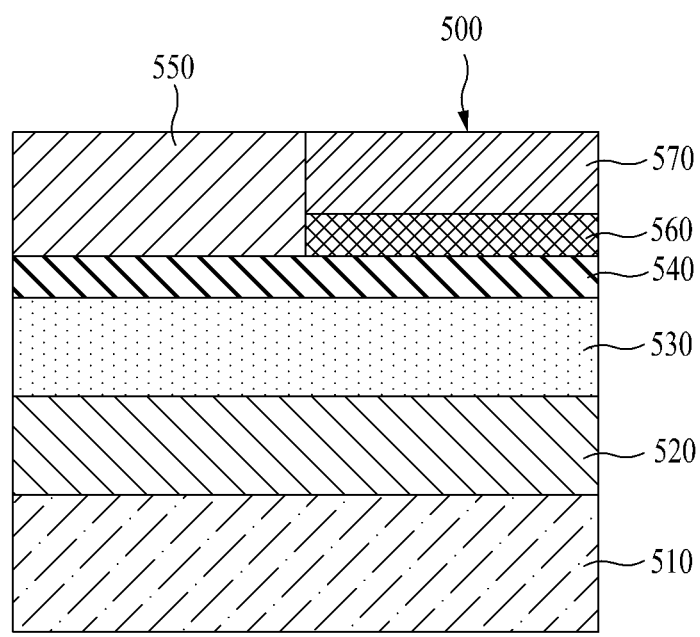
FIGS. 5A and 5B are diagrams illustrating a growth structure for a strained channel according to third embodiments.
Figure 5B:
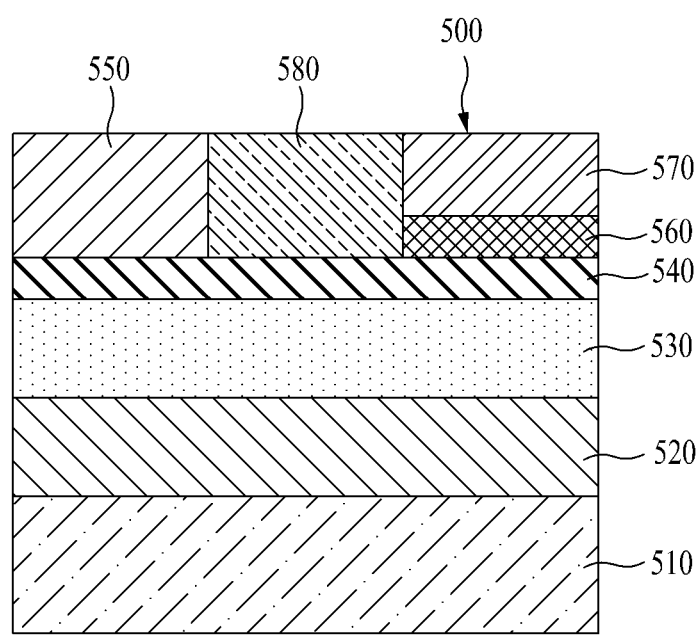

FIGS. 5A and 5B are diagrams illustrating a growth structure 500 for a strained channel according to third embodiments.

Referring to FIGS. 5A and 5B, the growth structure 500 for a strained channel according to the third embodiments may include a support substrate 510, an SRB layer 520, a base growth layer 530 and 540, and a strained channel layer 550, 560, 570, and 580.

The support substrate 510 may support the SRB layer 520, the base growth layer 530 and 540, and the strained channel layer 550, 560, 570, and 580. For example, the support substrate 510 may be made of silicon (Si).

The SRB layer 520 may be disposed on the support substrate 510. In this case, the SRB layer 520 may be a lattice mismatch with the strained channel layer 570. In other words, a lattice constant of the SRB layer 520 may be different from a lattice constant of the strained channel layer 570. Accordingly, a strain may be applied to the strained channel layer 570 through the SRB layer 520.

The base growth layer 530 and 540 and the strained channel layer 570 may be grown on the SRB layer 520 by using a hetero-epitaxy method. For example, the base growth layer 530 and 540 and the strained channel layer 570 may be made of a silicon (Si)-germanium (Ge) material. In this case, the base growth layer 530 and 540 and the strained channel layer 570 may be grown on the SRB layer 520 based on different etch rates.

The base growth layer 530 and 540 may be disposed on the SRB layer 520. In this case, the base growth layer 530 and 540 may be grown to have a first composition (e.g., y) on the SRB layer 520. For example, the base growth layer 530 and 540 may be made of at least one of silicon ($Si_{1-y}$) or germanium ($Ge_y$). Furthermore, the base growth layer 530 and 540 may include a plurality of layers. For example, the base growth layer 530 and 540 may include a buffer layer 530 and a p-type layer 540. The buffer layer 530 may be disposed on the SRB layer 520. The p-type layer 540 may be disposed on the buffer layer 530. For example, the buffer layer 530 may be denoted as a germanium (Ge)-rich silicon-germanium ($Si_{1-y}Ge_y$) buffer layer. The p-type layer 540 may be denoted as a p-type germanium (Ge)-rich silicon-germanium ($Si_{1-y}Ge_y$) material layer.

The strained channel layer 550, 560, 570, and 580 may be disposed on the base growth layer 530 and 540. In this case, the strained channel layer 550, 560, 570, and 580 may be grown as a dual channel structure. That is, as a strain is applied to the strained channel layer 550, 560, 570, and 580 by the SRB layer 220, the strained channel layer 550, 560, 570, and 580 may be grown to have a second composition (e.g., z) and a third composition (e.g., x) on the base growth layer 530 and 540. The strained channel layer 550, 560, 570, and 580 may include a first strained channel layer 550, an etch-stop layer 560, and a second strained channel layer 570. In some embodiments, the strained channel layer 550, 560, 570, and 580 may further include an insulating member 580.

The first strained channel layer 550 may be disposed on some area of the base growth layer 530 and 540. In this case, the first strained channel layer 550 may be grown to have a second composition (e.g., z) on some area of the base growth layer 530 and 540. In this case, the first strained channel layer 550 may be denoted as a tensile-strained channel layer. For example, the first strained channel layer 550 may be made of at least one of silicon ($Si_{1-z}$) or germanium ($Ge_z$).

The etch-stop layer 560 may be disposed on another area of the base growth layer 530 and 540. The second strained channel layer 570 may be disposed on the etch-stop layer 560. In this case, the second strained channel layer 570 may be grown to have a third composition (e.g., x) on the etch-stop layer 560. In this case, the second strained channel layer 570 may be denoted as a compressively strained channel layer. For example, the second strained channel layer 570 may be made of at least one of silicon ($Si_{1-x}$) or germanium ($Ge_x$).

The insulating member 580 may be interposed between the first strained channel layer 550 and the etch-stop layer 560 and between the first strained channel layer 550 and the second strained channel layer 570 on the base growth layer 530 and 540.

FIGS. 6A to 6H are diagrams illustrating a method of fabricating a strained channel according to the third embodiments.

First, after the growth structure 500 for a strained channel, such as that illustrated in FIG. 5A or 5B, and a base substrate 620 are prepared, as illustrated in FIGS. 6A to 6D, the growth structure 500 may be bonded to the top of the base substrate 620. In this case, the growth structure 500 may be bonded to the top of the base substrate 620 by using a monolithic integration method.

Figure 6A:
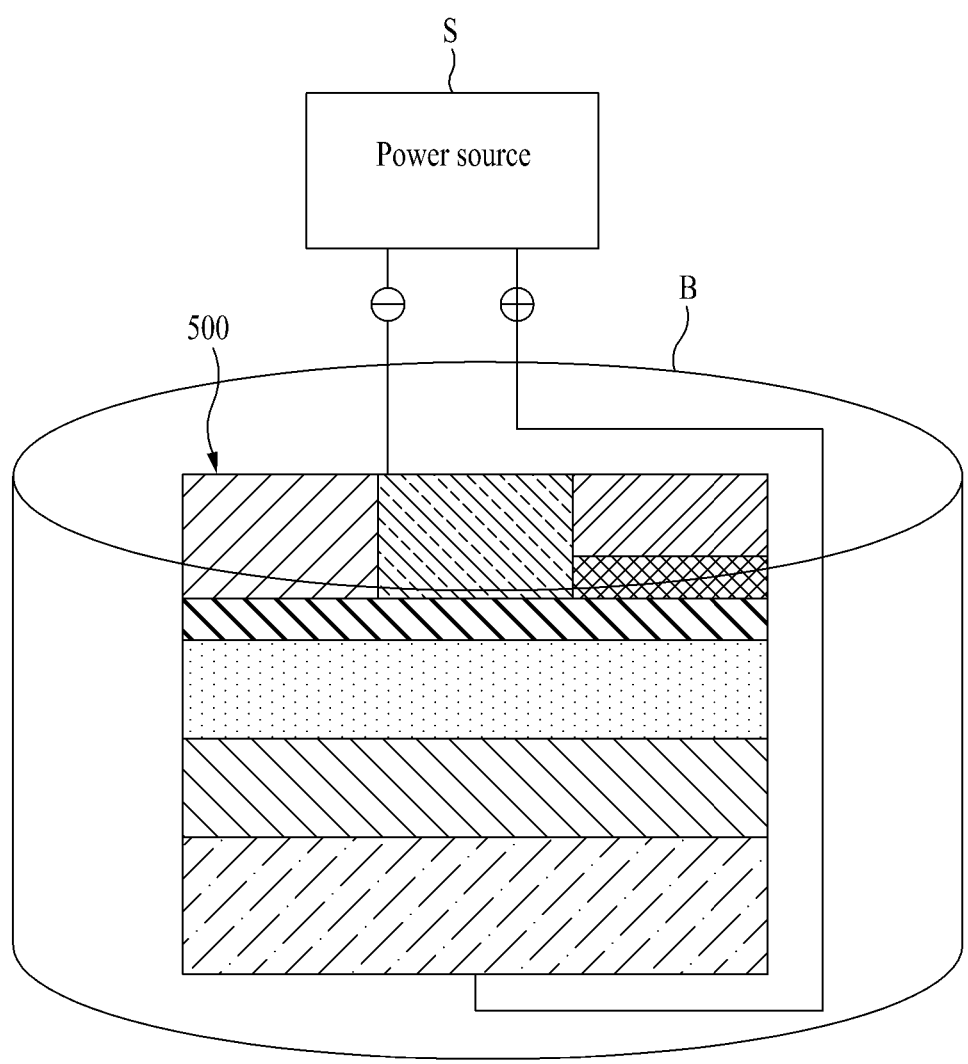
FIGS. 6A to 6H are diagrams illustrating a method of fabricating a strained channel according to the third embodiments.
Figure 6B:
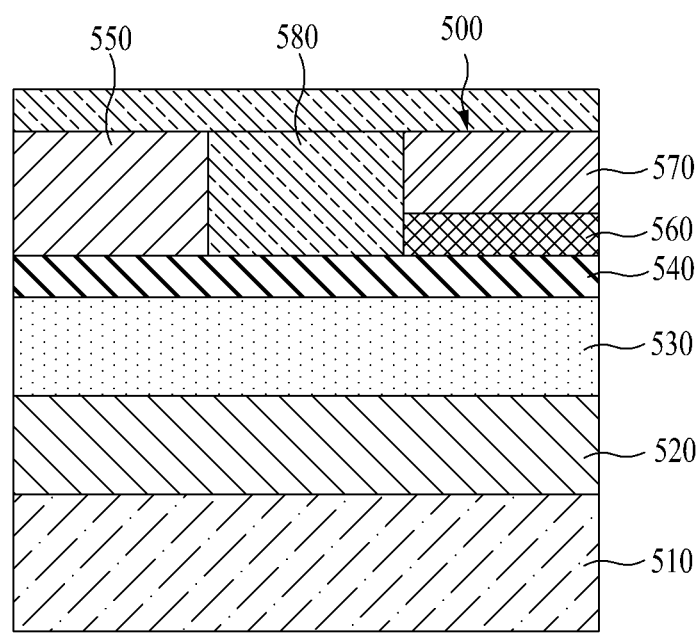

As illustrated in FIGS. 6A and 6B, a first insulating layer 610 may be formed on the strained channel layer 550, 560, 570, and 580 of the growth structure 500. In this case, the first insulating layer 610 may be formed on an strained channel layer 550, 560, 570, and 580 by using a thin film deposition technique. Specifically, as illustrated in FIG. 6A, the growth structure 500 may be dipped into a bath B containing a solvent, and a voltage may be applied to the growth structure 500 through a power source S. Accordingly, as illustrated in FIG. 6B, the first insulating layer 610 may be formed on the strained channel layer 550, 560, 570, and 580. In this case, the first insulating layer 610 may be formed on surfaces of the first strained channel layer 550 and the second strained channel layer 570. In some embodiments, if the strained channel layer 550, 560, 570, and 580 further includes the insulating member 580, the first insulating layer 610 may be formed on surfaces of the first strained channel layer 550, the insulating member 580, and the second strained channel layer 570.

Figure 6C:
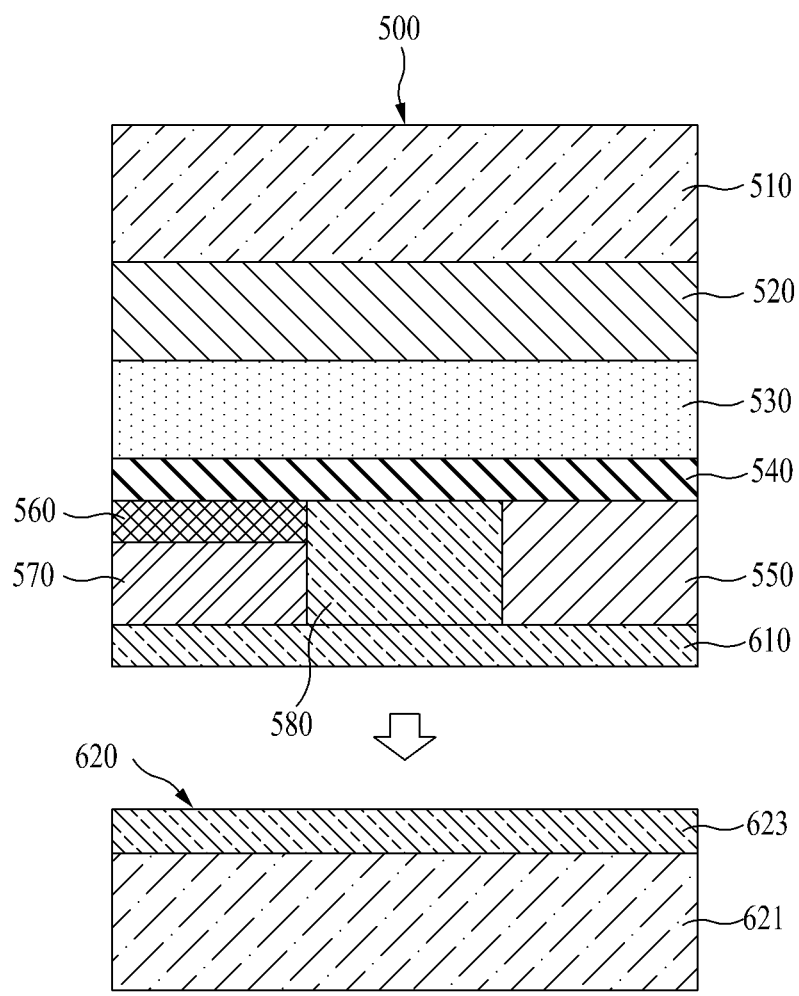

Next, as illustrated in FIG. 6C, the growth structure 500 may be rotated. That is, the growth structure 500 may be rotated so that the first insulating layer 610 is directed toward the base substrate 620, in other words, the base growth layer 530 and 540 and the strained channel layer 550, 560, 570, and 580 are inverted. The base substrate 620 may include a support substrate 621 and a second insulating layer 623 disposed on the support substrate 621. In this case, the second insulating layer 623 may be exposed to the growth structure 500, that is, the strained channel layer 550, 560, 570, and 580. Accordingly, the first insulating layer 610 may face the second insulating layer 623, the strained channel layer 550, 560, 570, and 580 may be disposed on the first insulating layer 610, and the base growth layer 530 and 540 may be disposed on the strained channel layer 550, 560, 570, and 580. In this case, the etch-stop layer 560 may be disposed on the second strained channel layer 570, the p-type layer 540 may be disposed on the etch-stop layer 560 and the first strained channel layer 550, and the buffer layer 530 may be disposed on the p-type layer 540. In some embodiments, if the strained channel layer 550, 560, 570, and 580 further includes the insulating member 580, the p-type layer 540 may be disposed on the etch-stop layer 560, the insulating member 580, and the first strained channel layer 550, and the buffer layer 530 may be disposed on the p-type layer 540. Furthermore, the SRB layer 520 may be disposed on the base growth layer 530 and 540, and the support substrate 510 may be disposed on the SRB layer 520.

Figure 6D:
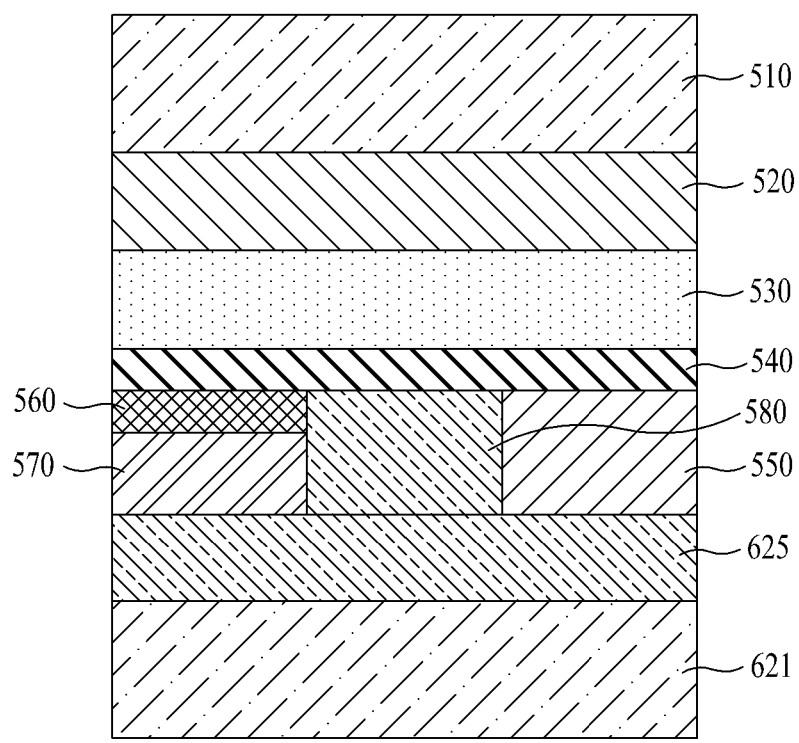

Next, as illustrated in FIG. 6D, the growth structure 500 may be bonded to the top of the base substrate 620. That is, the strained channel layer 550, 560, 570, and 580 may be bonded to the top of the base substrate 620 through the first insulating layer 610. In this case, as the first insulating layer 610 is combined with the second insulating layer 623, an insulating layer 625 may be formed between the strained channel layer 550, 560, 570, and 580 and the support substrate 621, and the strained channel layer 550, 560, 570, and 580 may be bonded to the top of the base substrate 620.

Figure 6E:
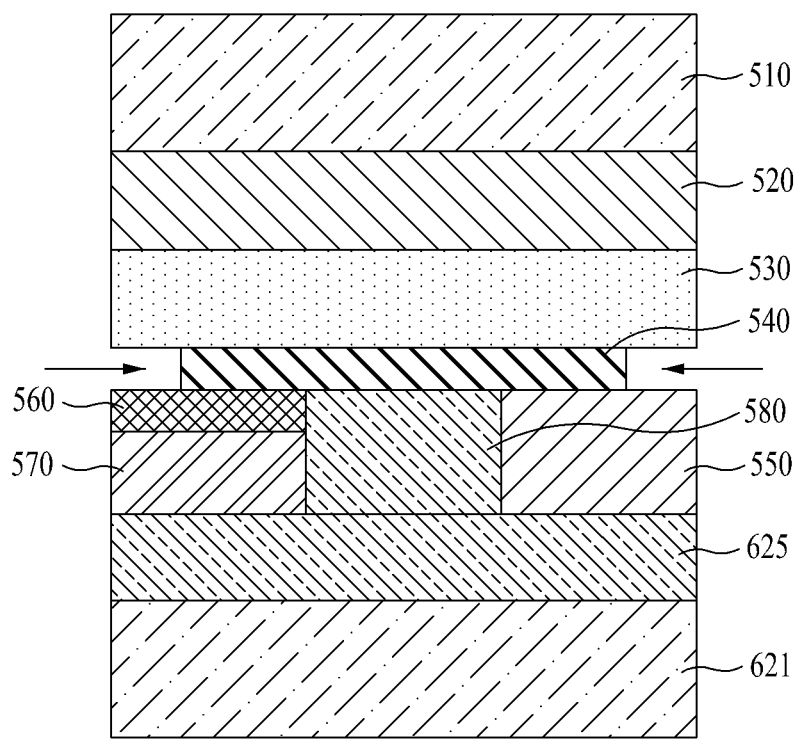
Figure 6F:
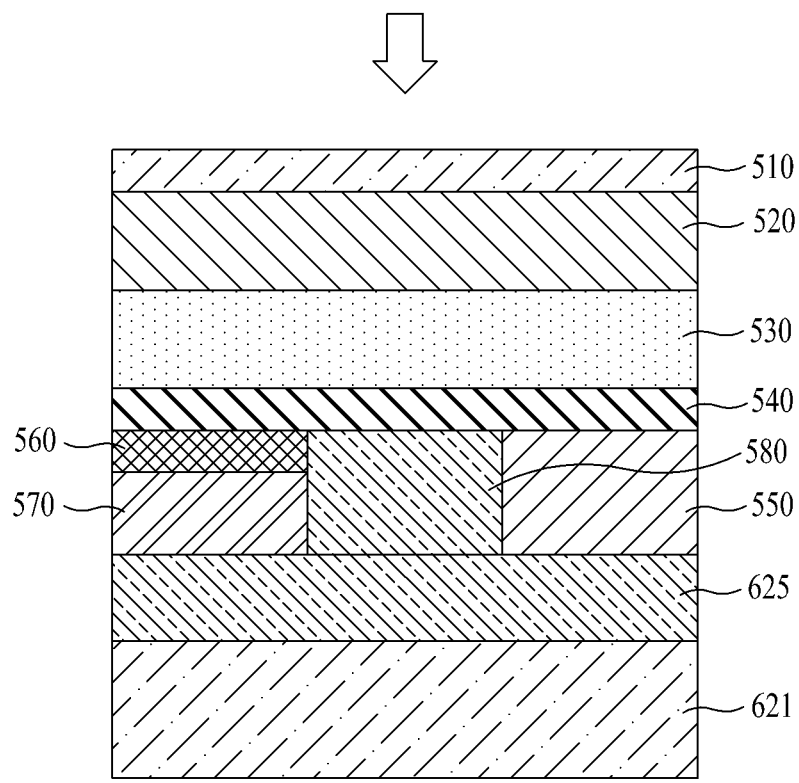
Figure 6G:
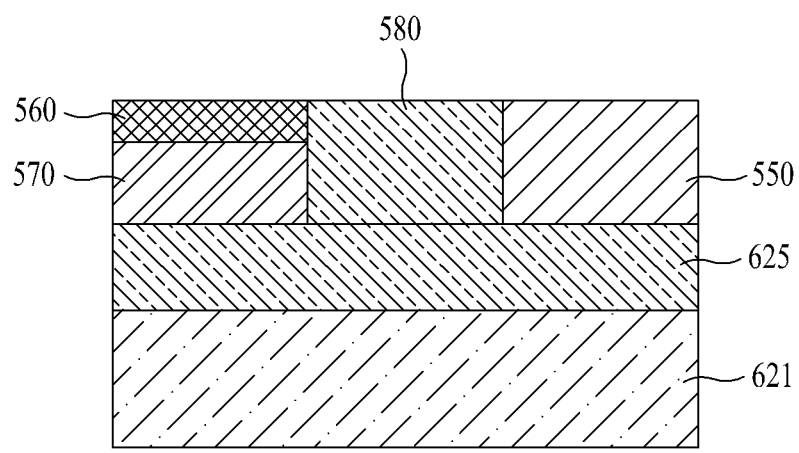
Figure 6H:
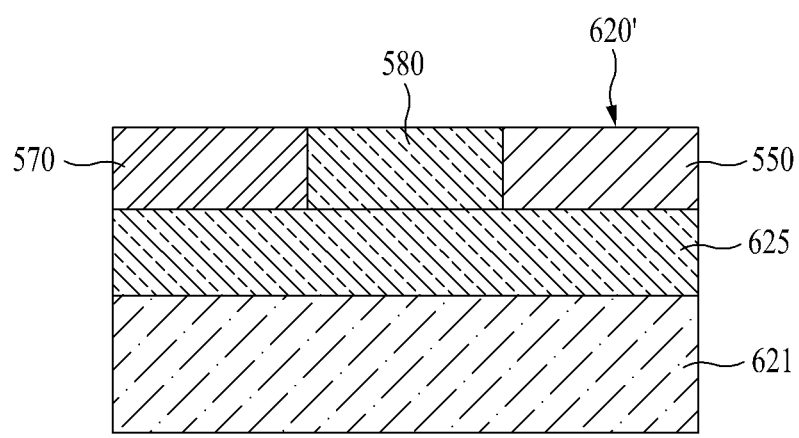

Finally, the etch-stop layer 560, the base growth layer 530 and 540, the SRB layer 520 and the support substrate 510 may be removed from the top of the strained channel layer 550, 560, 570, and 580. In this case, the base growth layer 530 and 540, the SRB layer 520, and the support substrate 510 may be removed from the top of the strained channel layer 550, 560, 570, and 580 by using at least one of an anodizing technique, a grinding technique or an etching technique. According to an embodiment, as illustrated in FIG. 6E, the p-type layer 540 may be removed from the top of the etch-stop layer 560 by using the anodizing technique. Optionally, a surface of the etch-stop layer 560 may be mechanically grinded. Accordingly, the buffer layer 530, the SRB layer 520, and the support substrate 510 may be separated from the strained channel layer 550, 560, 570, and 580. As a result, as illustrated in FIG. 6G, the etch-stop layer 560 and the second strained channel layer 570 may remain. According to another embodiment, as illustrated in FIG. 6F, the support substrate 510, the SRB layer 520, and the base growth layer 530 and 540 may be sequentially removed using the grinding technique and the etching technique. As a result, as illustrated in FIG. 6G, the etch-stop layer 560 and the second strained channel layer 570 may remain. Thereafter, as illustrated in FIG. 6H, the etch-stop layer 560 may be removed from the top of the second strained channel layer 570. In this case, a part of the first strained channel layer 550 may be removed along with the etch-stop layer 560 so that the first strained channel layer 550 has the same height as the second strained channel layer 570. In some embodiments, if the strained channel layer 550, 560, 570, and 580 further includes the insulating member 580, a part of the insulating member 580 may be further removed along with the etch-stop layer 560 so that the insulating member 580 has the same height as the second strained channel layer 570.

According to the third embodiments, as illustrated in FIG. 6H, a strained channel substrate 620' may be fabricated. The strained channel substrate 620' may include the support substrate 621, the insulating layer 625 disposed on the support substrate 621, and the strained channel layers 550, 570, and 580 disposed on the insulating layer 625. In this case, the strained channel layers 550, 570, and 580 may represent strained channels having a dual channel structure. That is, the strained channel layers 550, 570, and 580 may include the first strained channel layer 550 and the second strained channel layer 570 disposed on the insulating layer 625. In some embodiments, the strained channel layers 550, 570, and 580 may further include the insulating member 580 interposed between the first strained channel layer 550 and the second strained channel layer 570 on the insulating layer 625.

FIGS. 7A to 7E are diagrams illustrating a method of manufacturing a device 700 according to various embodiments.

As in the aforementioned embodiments, after a strained channel substrate 720 (e.g., 220' in FIG. 2F, 420' in FIG. 4G, or 620' in FIG. 6G) is fabricated, as illustrated in FIGS. 7A to 7E, electrodes 740, 770, and 780 may be formed on a strained channel layer 727 (e.g., 150 in FIG. 2F, 370 in FIG. 4G, 550 and 570 in FIG. 6F). In this case, the strained channel substrate 720 may include a base substrate 721 and 725, that is, a support substrate 721 (e.g., 221 in FIG. 2F, 421 in FIG. 4G, 621 in FIG. 6F), an insulating layer 725 (e.g., 225 in FIG. 2F, 425 in FIG. 4G, 625 in FIG. 6F) disposed on the support substrate 721, and the strained channel layer 727. The electrodes 740, 770, and 780 may include a gate 740, a source 770, and a drain 780. According to the first embodiments and the second embodiments, if the strained channel layer 727 has the single channel structure, the gate 740, the source 770, and the drain 780 may be formed on the strained channel layer 727. According to the third embodiments, if the strained channel layer 727 has the dual channel structure, the gate 740, the source 770, and the drain 780 may be formed on each of the first strained channel layer (e.g., 550 in FIG. 6G) and second strained channel layer (e.g., 570 in FIG. 6G) of the strained channel layer 727.

Figure 7A:
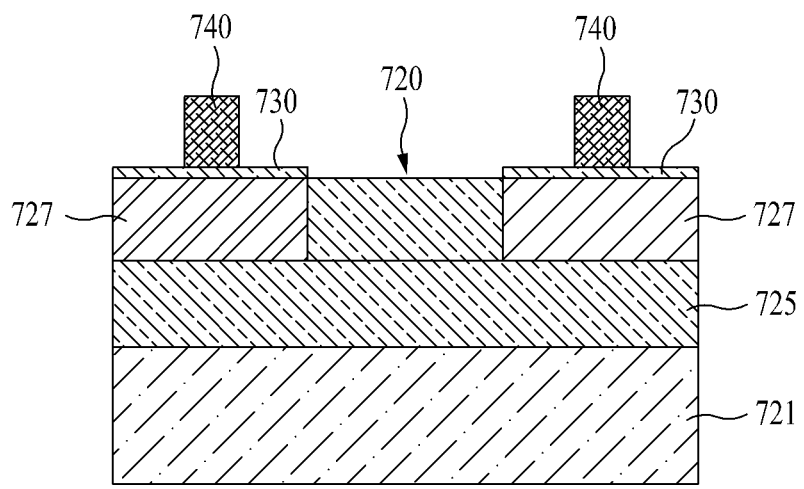
FIGS. 7A to 7E are diagrams illustrating a method of manufacturing a device according to various embodiments.
Figure 7B:
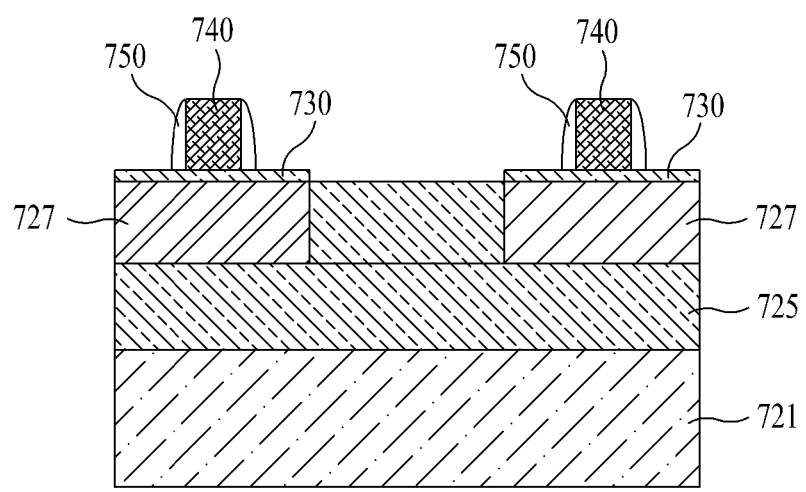

First, as illustrated in FIGS. 7A and 7B, the gate 740 may be formed over the strained channel layer 727. In this case, the strained channel layer 727 may be divided into a first area and a second area for the gate 740. Specifically, as illustrated in FIG. 7A, after an insulating material layer 730 is formed on the strained channel layer 727, the gate 740 may be formed on the insulating material layer 730 in accordance with the first area of the strained channel layer 727. For example, the insulating material layer 730 may be made of silicon (Si). Thereafter, as illustrated in FIG. 7B, a spacer 750 may be formed on the insulating material layer 730 in a way to surround the gate 740. In this case, the spacer 750 may expose the top of the gate 740.

Figure 7C:
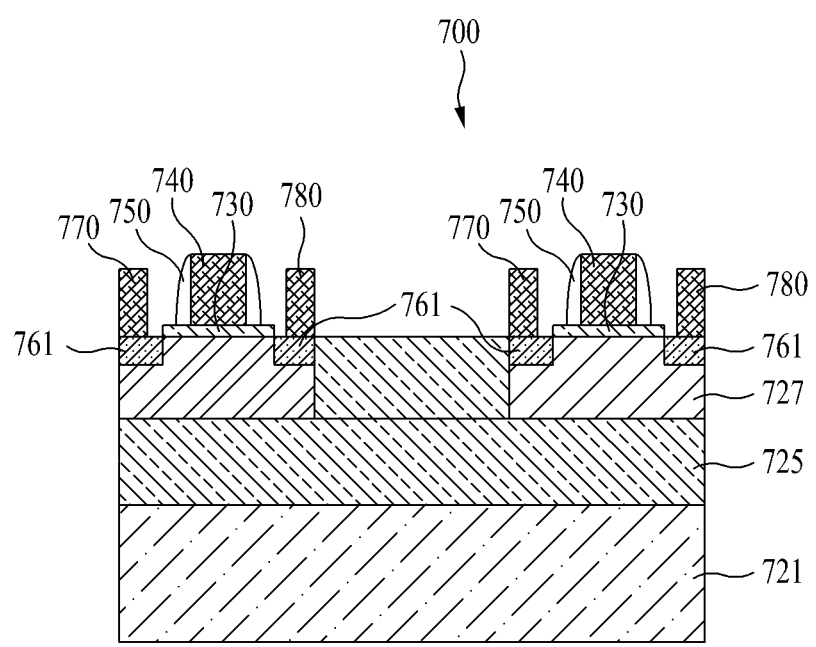
Figure 7D:
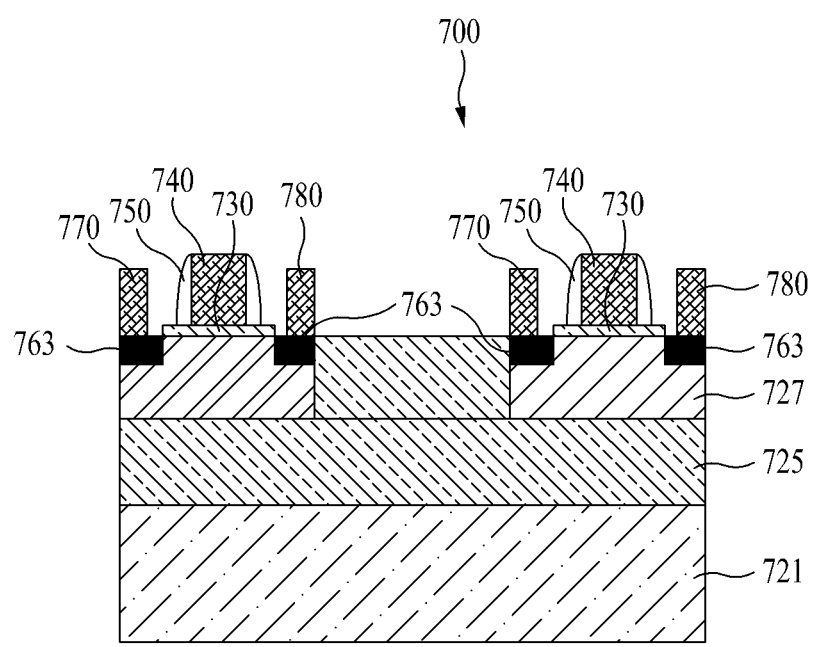
Figure 7E:
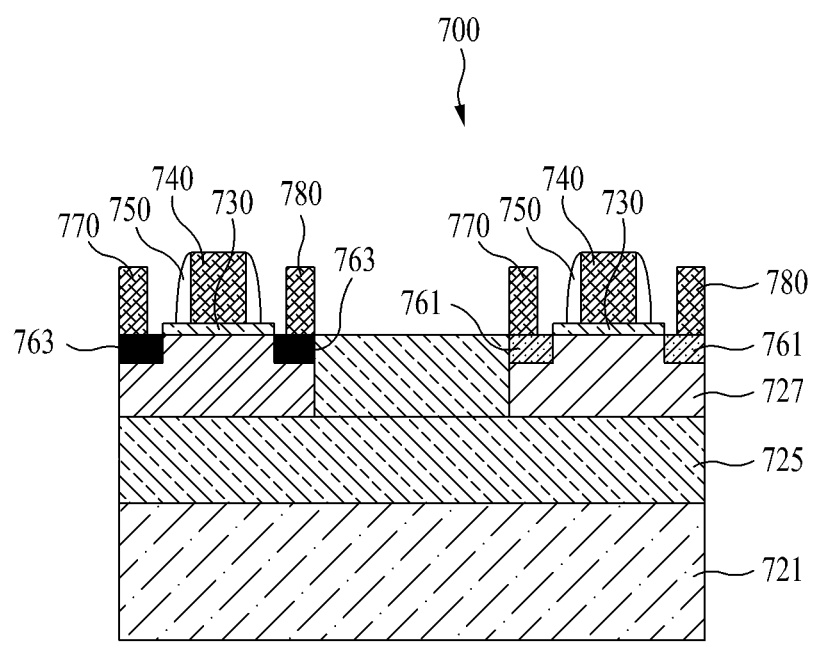

Next, as illustrated in one of FIG. 7C, 7D or 7E, the source 770 and the drain 780 may be formed on the strained channel layer 727. In this case, the source 770 and the drain 780 may be formed to be isolated from the gate 740, and may be formed to be isolated from each other. Specifically, after recesses isolated from each other are formed in the second area of the strained channel layer 727, contact material layers 761 and 763 may be formed within the recesses, respectively. According to an embodiment, as illustrated in FIG. 7C, the contact material layers 761 may be formed using ion implantation and an activation technique. According to another embodiment, as illustrated in FIG. 7D, the contact material layers 763 may be formed using an embedded technique. For example, the embedded technique may indicate an embedded SiGe SD (eSD) technique. According to still another embodiment, as illustrated in FIG. 7E, some of the contact material layers 763 may be formed using the ion implantation and the activation technique, and the remainder of the contact material layers 763 may be formed using the embedded technique. Specifically, if the strained channel layer 727 has a dual channel structure, the contact material layers 761 of a tensile-strained channel layer may be formed using the ion implantation and the activation technique, and the contact material layer 763 of a compressively strained channel layer may be formed using the embedded technique.

According to various embodiments, as illustrated in one of FIG. 7C, 7D or 7E, the device 700 may be fabricated.

According to various embodiments, the device 700 having the strained channel layer 727 may be fabricated using a monolithic integration method. That is, as the strained channel layer 150, 370, 550, 560, 570, 580 is grown on the support substrate 110, 310, 510 by using the hetero-epitaxy method, the growth structure 100, 300, 500 for a strained channel is implemented. Accordingly, the strained channel layer 150, 370, 550, 560, 570, 580 can be easily bonded to the top of the base substrate 220, 420, 620 based on the growth structure 100, 300, 500. Moreover, the device 700 having the strained channel layer 727 can be easily fabricated using the growth structure 100, 300, 500. Accordingly, the device 700 having improved operating performance can be fabricated.

The growth structure 100, 300, 500 for a strained channel according to various embodiments may include the support substrate 110, 310, 510, the SRB layer 120, 320, 520 disposed on the support substrate 110, 310, 510, the base growth layer 130, 140, 330, 340, 530, 540 grown to have one composition on the SRB layer 120, 320, 520, and the strained channel layer 150, 370, 550, 570 grown to have another composition on the base growth layer 130, 140, 330, 340, 530, 540.

According to various embodiments, the strained channel layer 150, 370, 550, 570 may include at least one of a tensile-strained channel layer or a compressively strained channel layer.

According to various embodiments, the tensile-strained channel layer and the compressively strained channel layer may be disposed on the base growth layer 130, 140, 330, 340, 530, 540.

According to various embodiments, the base growth layer 130, 140, 330, 340, 530, 540 and the strained channel layer 150, 370, 550, 560, 570, 580 may be made of at least one of silicon or germanium, and may be grown based on different etch rates.

According to various embodiments, the strained channel layer 550, 560, 570, and 580 may further include the insulating member 580 interposed between the tensile-strained channel layer and the compressively strained channel layer.

According to various embodiments, the strained channel layer 370, 550, 560, 570, 580 may further include the etch-stop layer 360, 560 interposed between the base growth layer 330, 340, 530, 540 and the compressively strained channel layer.

According to various embodiments, the base growth layer 130, 140, 330, 340, 530, 540 may include the buffer layer 130, 330, 430 disposed on the SRB layer 120, 320, 520 and the p-type layer 140, 340, 440 disposed on the buffer layer 130, 330, 430.

A method of fabricating a strained channel according to various embodiments may include steps of preparing the growth structure 100, 300, 500 for a strained channel and the base substrate 220, 420, 620, rotating the growth structure 100, 300, 500 and bonding the strained channel layer 150, 370, 550, 560, 570, 580 to the top of the base substrate 220, 420, 620, and removing the base growth layer 130, 140, 330, 340, 530, 540, the SRB layer 120, 320, 520, and the support substrate 110, 310, 510 from the top of the strained channel layer 150, 370, 550, 560, 570, 580 by leaving the strained channel layer 150, 370, 550, 560, 570, 580 on the base substrate.

According to various embodiments, the step of bonding the strained channel layer 150, 370, 550, 560, 570, 580 to the top of the base substrate 220, 420, 620 may include steps of forming the first insulating layer 210, 410, 610 on the strained channel layer 150, 370, 550, 560, 570, 580 of the growth structure 100, 300, 500, and rotating the growth structure 100, 300, 500 so that the strained channel layer 150, 370, 550, 560, 570, 580 and the first insulating layer 210, 410, 610 are inverted and bonding the strained channel layer 150, 370, 550, 560, 570, 580 to the top of the base substrate 220, 420, 620 through the first insulating layer 210, 410, 610.

According to various embodiments, the base substrate 220, 420, 620 may include the second insulating layer 223, 423, 623 exposed to the strained channel layer 150, 370, 550, 560, 570, 580.

According to various embodiments, the step of bonding the strained channel layer 150, 370, 550, 560, 570, 580 to the top of the base substrate 220, 420, 620 through the first insulating layer 210, 410, 610 may include the step of bonding the strained channel layer 150, 370, 550, 560, 570, 580 to the top of the base substrate 220, 420, 620 by combining the first insulating layer 210, 410, 610 with the second insulating layer 223, 423, 623.

According to various embodiments, the step of forming the first insulating layer 210, 410, 610 may include forming the first insulating layer 210, 410, 610 by using a thin film deposition technique.

According to various embodiments, the step of removing the base growth layer 130, 140, 330, 340, 530, 540, the SRB layer 120, 320, 520, and the support substrate 110, 310, 510 may be performed by using at least one of an anodizing technique, a grinding technique or an etching technique.

According to various embodiments, the base growth layer 130, 140, 330, 340, 530, 540 may include the buffer layer 130, 330, 530 disposed on the SRB layer 120, 320, 520, and the p-type layer 140, 340, 540 disposed on the buffer layer 130, 330, 530.

According to various embodiments, the step of removing the base growth layer 130, 140, 330, 340, 530, 540, the SRB layer 120, 320, 520, and the support substrate 110, 310, 510 may include removing the p-type layer 140, 340, 540 by using the anodizing technique so that the buffer layer 130, 330, 530, the SRB layer 120, 320, 520, and the support substrate 110, 310, 510 are separated from the strained channel layer 150, 370, 550, 560, 570, 580.

A method of fabricating the device 700 according to various embodiments may include a step of forming the electrodes 740, 770, and 780 on the strained channel layer 727 remained on the base substrate 721 and 725.

According to various embodiments, the step of forming the electrodes 740, 770, and 780 may include steps of forming the gate 740 on the strained channel layer 727, and forming the source 770 and the drain 780 on the strained channel layer 727 so that the source 770 and the drain 780 are isolated from the gate 740.

According to various embodiments, the strained channel layer 727 may be divided into a first area for the gate 740 and a second area for the remainder.

According to various embodiments, the step of forming the gate 740 may include steps of forming the insulating material layer 730 on the strained channel layer 727, forming the gate 740 on the insulating material layer 730 in accordance with the first area, and forming, on the insulating material layer 730, the spacer 750 surrounding the side of the gate 740.

According to various embodiments, the step of forming the source 770 and the drain 780 may include steps of forming, in the second area, recesses isolated from each other, forming the contact material layers 761 and 763 within the recesses, respectively, and forming the source 770 and the drain 780 on the contact material layers 761 and 763, respectively.

According to various embodiments, the step of forming the contact material layers 761 and 763 may include forming the contact material layers 761 and 763 by using at least one of ion implantation and an activation technique or an embedded technique.

According to various embodiments, the step of forming the contact material layers 761 and 763 may include forming at least some of the contact material layers 761 by using the ion implantation and the activation technique if the strained channel layer 727 includes a tensile-strained channel layer, and forming at least some of the contact material layers 763 by using the embedded technique if the strained channel layer 727 includes a compressively strained channel layer.

Various embodiments of this document and the terms used in the embodiments are not intended to limit the technology described in this document to a specific embodiment, but should be construed as including various changes, equivalents and/or alternatives of a corresponding embodiment.

Regarding the description of the drawings, similar reference numerals may be used in similar elements. An expression of the singular number may include an expression of the plural number unless clearly defined otherwise in the context. In this document, an expression, such as "A or B", "at least one of A and/or B", "A, B or C" or "at least one of A, B and/or C", may include all of possible combinations of listed items together. Expressions, such as "a first," "a second," "the first" and "the second", may modify corresponding elements regardless of the sequence and/or importance, and are used to only distinguish one element from the other element and do not limit corresponding elements. When it is described that one (e.g., a first) element is "(operatively or communicatively) connected to" or "coupled with" the other (e.g., a second) element, one element may be directly connected to the other element or may be connected to the other element through another element (e.g., a third element).

According to various embodiments, each (e.g., module or program) of the described elements may include a single entity or a plurality of entities. According to various embodiments, one or more elements or operations of the aforementioned elements may be omitted or one or more other elements or operations may be added. Alternatively or additionally, a plurality of elements (e.g., modules or programs) may be integrated into a single element. In such a case, the integrated element may perform a function performed by a corresponding one of the plurality of elements before at least one function of each of the plurality of elements is integrated identically or similarly. According to various embodiments, operations performed by a module, a program or another element may be executed sequentially, in parallel, iteratively or heuristically, or one or more of the operations may be executed in different order or may be omitted, or one or more other operations may be added.

The invention claimed is:

1. A growth structure for a strained channel, comprising:
   a support substrate;
   a strain-relaxed buffer (SRB) layer disposed on a support substrate;
   a base growth layer grown to have a first composition on the SRB layer, wherein the base growth layer comprises: a buffer layer disposed on the SRB layer and a p-type layer disposed on the buffer layer,
   a first strained channel layer grown to have a second composition on the base growth layer;
   a first etch-stop layer adjacent to the first strained channel layer; and
   a second strained channel layer grown to have a third composition on the first etch-stop layer, wherein the second strained channel layer is adjacent to the first strained channel layer.

2. The growth structure of claim 1, wherein the first strained channel layer comprises at least one of a tensile-strained channel layer or a compressively strained channel layer.

3. The growth structure of claim 2, wherein the tensile-strained channel layer and the compressively strained channel layer are disposed on the base growth layer.

4. The growth structure of claim 1, wherein the base growth layer and the first strained channel layer are made of at least one of silicon or germanium and are grown based on different etch rates.

5. The growth structure of claim 3, wherein the first strained channel layer further comprises an insulating member interposed between the tensile-strained channel layer and the compressively strained channel layer.

6. The growth structure of claim 2, wherein the first strained channel layer further comprises a second etch-stop layer interposed between the base growth layer and the compressively strained channel layer.

7. The growth structure of claim 1,
   further comprising an insulating member interposed between the first strained channel layer and the first etch stop layer, and between the first strained channel layer and the second strained channel layer on the base growth layer.

* * * * *

UNITED STATES PATENT AND TRADEMARK OFFICE
CERTIFICATE OF CORRECTION

PATENT NO. : 12,218,238 B2
APPLICATION NO. : 17/522851
DATED : February 4, 2025
INVENTOR(S) : Sanghyeon Kim et al.

It is certified that error appears in the above-identified patent and that said Letters Patent is hereby corrected as shown below:

In the Claims

| Column | Lines | |
|---|---|---|
| 14 | 4 | Claim 1, delete "layer," and insert -- layer; --. |
| 14 | 34-38 | Claim 7, delete "further comprising an insulating member interposed between the first strained channel layer and the first etch stop layer, and between the first strained channel layer and the second strained channel layer on the base growth layer." and insert the same at Line 33, after "claim 1," as a continuously point. |

Signed and Sealed this
Twenty-seventh Day of January, 2026

John A. Squires
*Director of the United States Patent and Trademark Office*